United States Patent [19]

Hakoune

[11] 4,425,769

[45] Jan. 17, 1984

[54] METHOD FOR TREATING A GEM AND GEM TREATED WITH THIS METHOD

[76] Inventor: Maurice Hakoune, Belgiëlei, 147, Antwerp, Belgium

[21] Appl. No.: 375,663

[22] Filed: May 6, 1982

[30] Foreign Application Priority Data

May 7, 1981 [BE] Belgium ................................. 204718

[51] Int. Cl.$^3$ ........................ C23C 15/00; A44C 17/00
[52] U.S. Cl. .......................................... 63/32; 40/629; 204/192 E; 156/643; 427/7; 428/916
[58] Field of Search .................... 204/192 E, 192 EC; 427/7; 428/916; 63/32; 125/30 R; 156/643; 40/629

[56] References Cited

U.S. PATENT DOCUMENTS

| | | |
|---|---|---|
| 3,945,902 | 3/1976 | Hawrylo et al. .................... 204/192 |
| 4,056,952 | 11/1977 | Okuda ...................................... 63/32 |
| 4,219,199 | 8/1980 | Okuda .................................. 274/38 |

FOREIGN PATENT DOCUMENTS 2035132  6/1980  United Kingdom ................... 427/7

*Primary Examiner*—Aaron Weisstuch
*Attorney, Agent, or Firm*—Fleit, Jacobson, Cohn & Price

[57] ABSTRACT

A method for treating a gem stone to cause a marking thereon, wherein a photoresist resin is secured to the stone, a photographic film bearing the desired marking is applied over said resin, said resin is developed by exposing same to a light source, the exposed portions of said resin, as well as said film, are removed, and the thus-treated portion of the stone is subjected to a cathode bombardment in such a way that etching of the stone occurs in those locations which are not protected by said resin.

12 Claims, No Drawings

METHOD FOR TREATING A GEM AND GEM TREATED WITH THIS METHOD

This invention pertains to a method for treating a gem to effect a marking on one side or facet, to enable indentifying a gem which has been treated in this way.

Due to the high value thereof, diamonds and many other gems have to be identified.

Some gem laboratories give genuineness certificates which guarantee the degree of purity, the color and other features of the gem. Due to such certificates, investing in diamonds and colored stones has become more attractive. However, gems or stones which have been certified in this way should, in order to maintain such guaranty, remain inside small bags, such as plastic bags, and, moreover, should be locked into safes, which, in turn, prevents the owners of such jewels from enjoying the ornaments said gems or stones are part of. Moreover, frauds or counterfeitings of the certificates are still possible, which makes this identifying system relatively unsecure.

It has already been proposed, on the other hand, to provide the stones proper with identifying markings. One of the oldest attempts of this kind has been disclosed in Belgian Pat. No. 373,939, which pertains to a method for identifying gems which have been given to a lapidary for performing finishing operations. According to this method, the stone which is to be treated is coated with a solid, adhesive coating which characterizes it and the presence of which is maintained through the cutting and polishing operations.

More up-to-date methods, also with the purpose of identifying gems or precious stones, propose to generate thereon a relief coating of microscopic size which is invisible to the naked eye. The drawback of such identifying markings lies of course in the possibility of the markings vanishing when such markings are subjected to polishing or abrading. Such methods have been disclosed in Belgian Pat. Nos. 840,671 and 868,383.

Another attempted solution is proposed in Belgian Pat. No. 877,326, the laser-engraving method, which generates markings with too-large a size, said markings being visible with a magnifier, but which may, in some conditions, lower the value of a diamond when one side or facet which bears a marking which is too noticeable.

Finally, Belgian Pat. No. 878,738 discloses the method of causing, inside the diamond proper, an identifying marking by irreversible conversion of a determined area. This means generating inside the diamond a dark marking, which is absolutely out of the question.

This invention is a method which provides a new solution without any of the drawbacks contained in the above-defined methods. The method according to this invention allows, without impairing a diamond's value, providing said diamond with a marking which is readable with a microscope and absolutely indelible.

For this purpose, according to the invention a photoresist resin is secured to the stone; a photographic film bearing the desired marking is applied over said resin; the resin is developed by exposing the same to a light source; the exposed portions of said resin, as well as said film are removed in a way known per se; and the thus-treated portion of the stone is subjected to a cathode bombardment in such a way that etching of the stone appears in those locations which are not protected by said resin.

According to this invention, said cathode bombardment is performed inside a vacuum enclosure.

Advantageously, said cathode bombardment is obtained by feeding argon, hydrogen, methane, or a mixture of hydrogen and argon to said vacuum enclosure.

In an optional embodiment of the method according to the invention, the etched portion of the stone is coated with a metal oxide.

Other details and features of the invention will be apparent from the following description, given by way of a non-limitative example.

Even if the method according to the invention is to be used with high-value stones, that is, mainly with diamonds, the use thereof may be considered for stones of any nature whatsoever. The word "stone" should not be construed in any limitative way.

The method according to the invention may be defined by the following steps:

1. Cleaning and drying of the stone.

The cleaning, which naturally has for its object the insuring of a perfect adhesion of any material which is thereafter deposited on the stone, is obtained, for example, by cleaning the stone for a few minutes in ethyl alcohol, causing complete dissolution of any surface traces of organic material. Stirring, obtained, for example, with ultrasound, may be provided. Drying of the stone is performed by subjecting the stone to a pulsed hot air stream.

2. Deposition of a photoresist resin.

A resin which is perfectly suitable for the defined purpose is a product sold under the name "AZ-1350" by the firm Shipley. Other products with similar properties which are also used as photoresists or photomasks may also be used, for example, "KPR" from Kodak.

3. Next, the photoresist resin is dried and a photographic film, the microscopic light-pervious portions of which define a marking or character which corresponds to the identifying means for the stone or diamond, is applied. Exposure of the photoresist through said photographic film is followed by the development of said photoresist by etching.

4. The next step is the drying of the photoresist which has been etched during the preceding step to produce pits, corresponding to the required identifying markings according to the pattern provided on the photographic film. Consequently, the stone is unprotected at the etched portions of the photoresist.

5. The stone, having been treated by the above-defined steps, is positioned inside a vacuum chamber and etched by cathode bombardment with an ionized gas.

6. The etched portions of the stone may be given an optional coating of a metal oxide, following by removal of the photoresist, which may be done by hand with a rag which has been soaked with ethyl alcohol or acetone.

The following details may be given regarding the above-defined operations. It has been observed that in order to obtain etchings which are deep enough, and to insure protection of the underlying surfaces with the optional metal oxide coating, an original thickness of the photoresist resin in the range of $0.8\mu$ is required. Such a thickness has no effect on the resolution of the etched pattern. The thickness of the photoresist resin coating is adjusted by means of the centrifugating speed which is imparted to the stone to spread the resin evenly. Indeed, such an operation known per se is required to spread the resin evenly.

Drying of said resin is obtained after a few minutes at a temperature of about 60° C., which insures complete evaporation of the resin solvent. The exposure operation is effected by means of shining a UV lamp through the highcontrast photographic film which is applied over said resin, and requires an exposure for about 45 seconds, while the UV-radiation source is located some 25 to 30 cm away. The developed portions of the photoresist resin, which is treated with a developer diluted with distilled water, permit the bombarding ions pass through to generate the required identifying marking. Thorough rinsing of the photoresist resin should be provided after removing said photographic film.

Maximized resistance of the photoresist to ion impact during the cathode bombardment process is obtained by drying the photoresist resin for about 5 minutes.

Etching of the stone is performed inside a high vacuum enclosure or chamber, preferably in the presence of argon, the plasma of which enables surface molecule stripping of the stone being etched. Argon gas may be replaced by hydrogen or a mixture of argon and hydrogen. The degree of etching of the stone is however lower in said latter conditions. It is also possible to use methane in lieu of the gases or gas mixtures described above. The cathode bombardment, which is also called "sputter etching", causes etching of those portions of the stone which are not protected by the photoresist resin. The etching depth may vary between 50 and 500 Angstroms. The etched lines obtained according to the above-defined method are invisible to the naked eye, as it may be reckoned that the thickness thereof is 50 to 500 times thinner than a hair thickness which corresponds, in turn, to 0.001 millimeter. The identifying marking imprinted on the stone, due to the cathode bombardment in the above-defined conditions, does not impair the stone value and does not tamper in any way with the qualities and sparkle of the stone.

The etched stone portions may additionally be provided with a coating of a metal oxide.

The materials selected for such a coating of the etched portions should have optimized characteristics of chemical strength and a lack of inherent coloring. Metals are thus to be avoided, and only oxides of some metals should be considered. The best results have been obtained with deposits of titanium oxide ($TiO_2$), lead oxide (PbO), and zirconia oxide ($ZrO_2$). Said three oxides do not end the list of possibilities and are only given by way of example.

Deposition of a metal oxide over the etched stone portions may be performed by various processes. Two such processes are given by way of example:

reactive sputtering of a metal target in the presence of oxygen;

high-frequency sputtering of a target which is comprised of the metal whose oxide is to be deposited, for example in the presence of argon.

It is clear that every required measure should be taken to avoid the coating thickness from becoming thicker than the etching depth.

The metal oxide coating improves readability with a microscope. The refractive index differential between the materials comprising the stone and the metal oxide results in improving the readability with a microscope.

By way of example it will be noted that the refractive index of diamond is 2.417; while the refractive index of the titanium oxide deposit as performed in the above-defined conditions lies between 2.3 and 2.5, which is very near the diamond index, and thus making the marking completely invisible to the naked eye.

From the above description of the method according to the invention, there are a number of substantial advantages which distinguish the method according to the invention from other methods, significantly the ones which have been defined in the preamble.

Said advantages are as follows:

the etching obtained is invisible to the naked eye;

there is no change in the purity or color of the stone;

lack of any danger to the stone proper;

no change in the sparkle, brilliancy, or light diffraction of the stone;

impossibility of counterfeiting or of damaging, in any way, the stone, which may be mounted in an article of jewelry;

easy readability with a microscope by a layman.

As regards readability, it is indeed of importance to note that with conventionally obtained, very thin marking depths, visibility with a microscope may presently be obtained only with methods that make use of interferometry or phase-contrasting processes with liquids having a refraction index which approximates the diamond refraction index, said liquids having a toxicity which is not to be neglected.

Such drawbacks are not encountered with the method according to the invention, as the reading is made with an ordinary microscope.

It will finally be noted that the etched marking is naturally unalterable, unless the stone is subjected to a new polishing which will, of course, lower the value thereof.

It must be understood that the invention is in no way limited to the above embodiments and that many changes may be contemplated without departing from the scope of the invention as defined by the appended claims.

I claim:

1. A method for treating a gem stone to provide it with a marking on the surface thereof in order to permit identification thereof, wherein a photoresist resin is secured to the stone; a photographic film bearing the desired marking pattern is applied over said resin; said resin is developed by exposing same to a light source; the exposed portions of said resin, as well as said film, are removed; and the stone is then subjected to cathode bombardment in such a way that etching of the stone occurs at those locations which are not protected by said resin.

2. A method as defined in claim 1, wherein said cathode bombardment is performed inside a vacuum enclosure.

3. A method as defined in claim 2, wherein said cathode bombardment is performed in the presence of argon.

4. A method as defined in claim 2, wherein said cathode bombardment is performed in the presence of hydrogen.

5. A method as defined in claim 2, wherein said cathode bombardment is performed in the presence of methane.

6. A method as defined in claim 2, wherein said cathode bombardment is performed in the presence of a mixture of hydrogen and argon.

7. A method as defined in claim 1, wherein the engraved areas obtained during said cathode bombardment are coated with a metal oxide, the thickness of which is not deeper than the engraving depth.

8. A method as defined in claim 7, wherein said metal oxide is comprised of titanum oxide (TiO$_2$).

9. A method as defined in claim 7, wherein said metal oxide is comprised of lead oxide (PbO).

10. A method as defined in claim 7, wherein said metal oxide is comprised of zirconia oxide (ZrO$_2$).

11. A method as defined in claim 7, wherein said metal oxide coating is obtained by ion bombardment of a target of the corresponding pure metal in the presence of an oxidizing gas.

12. A gem stone bearing a marking as obtained with the method as defined in claim 1.

* * * * *